(12) United States Patent
Matthies

(10) Patent No.: US 6,600,144 B2
(45) Date of Patent: Jul. 29, 2003

(54) REDUCING THE VISIBILITY OF SEAMS OF MODULAR DISPLAYS

(75) Inventor: Dennis L. Matthies, Princeton, NJ (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 09/904,241

(22) Filed: Jul. 12, 2001

(65) Prior Publication Data

US 2003/0010893 A1 Jan. 16, 2003

(51) Int. Cl.⁷ .............................................. H01L 27/00
(52) U.S. Cl. ...................... 250/208.1; 250/216; 345/32
(58) Field of Search ............................... 250/208.1, 204, 250/207, 330, 361 R, 458.1, 483.1, 214.1, 216, 239; 353/34; 359/109, 443; 348/294, 322; 345/7, 9, 11–12, 32

(56) References Cited

U.S. PATENT DOCUMENTS 5,661,531 A * 8/1997 Greene et al. ................ 349/73
6,341,879 B1 * 1/2002 Skinner et al. ............. 362/295
6,476,886 B2 * 11/2002 Krusius et al. ................ 349/73

FOREIGN PATENT DOCUMENTS

| WO | WO 99/41732 | 8/1999 |
|----|-------------|--------|
| WO | WO 99/41787 | 8/1999 |
| WO | WO 99/41788 | 8/1999 |

* cited by examiner

*Primary Examiner*—David Porta
*Assistant Examiner*—Patrick J Lee
(74) *Attorney, Agent, or Firm*—Trop, Pruner & Hu, P.C.

(57) ABSTRACT

Relatively thick glass panels can be utilized in displays formed in a modular fashion. Modular displays may include a plurality of tiles having glass panels which are abutted together to present a composite display. The image generated by the composite display is made up of the images of each of the tiles. Tiles with front glass panels that are relatively thick may be utilized without unduly blocking light emitted from the display or creating relatively visible seams between adjacent tiles. This may be done by providing a pattern of black lines that separates the individual pixels including mullions over gaps between adjacent tiles and index matching the gaps to the transparent layers.

18 Claims, 6 Drawing Sheets

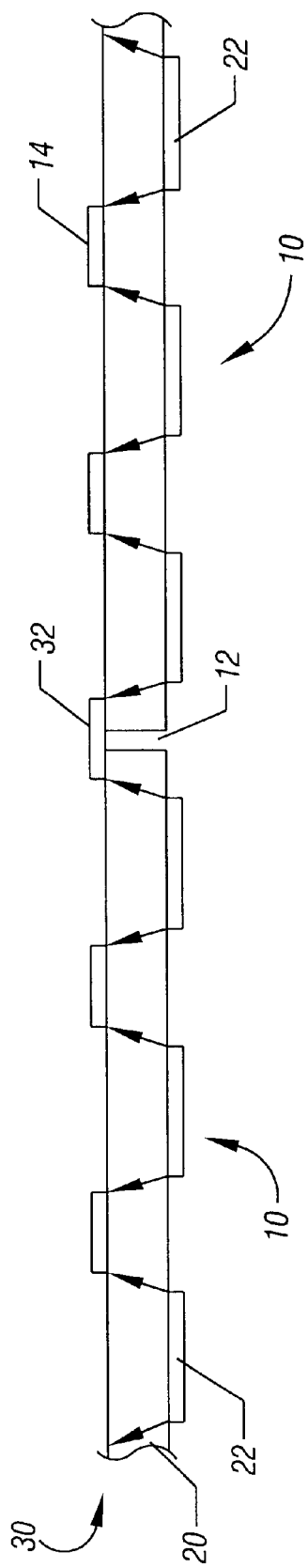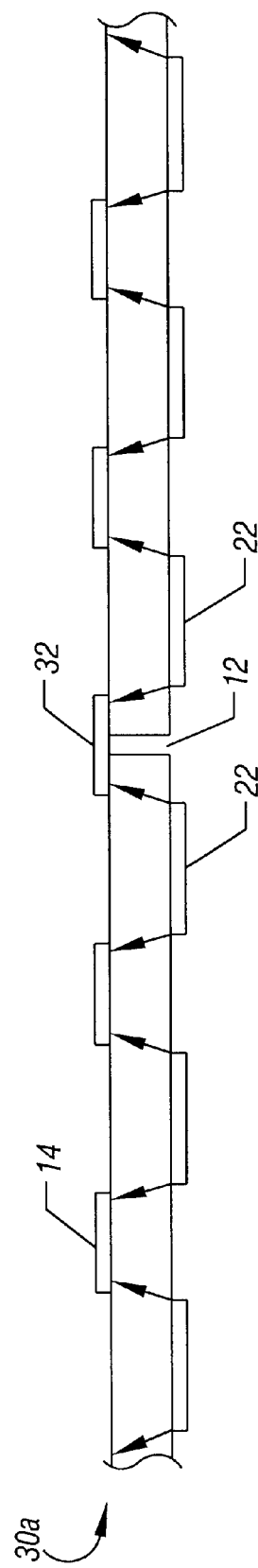

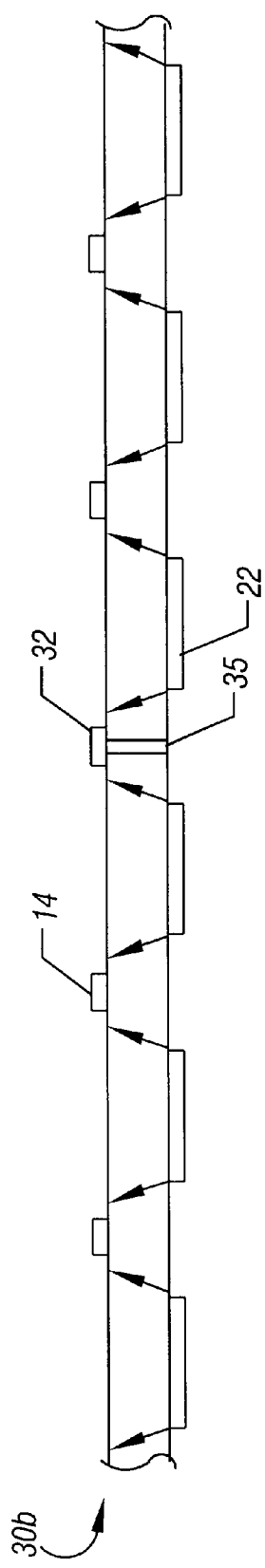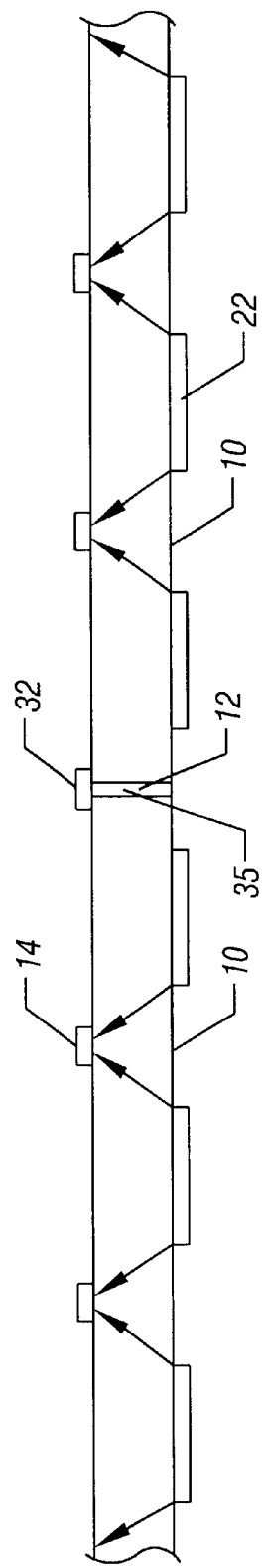

REDUCING THE VISIBILITY OF SEAMS OF MODULAR DISPLAYS

BACKGROUND

This invention relates generally to modular displays.

A modular display is a display that is formed from a plurality of tiles that are connected together to develop an overall display. Each tile is a physical unit which is juxtaposed with other tiles. Each tile produces a portion of the overall image created by the tiled, modular display.

Necessarily, gaps or optical interfaces are created between adjacent tiles. To the extent that these gaps are visible to users of the modular display, the modular display may be less desirable than a monolithic or one piece display. The appearance of the gaps between the individual tile distracts from the overall seamless appearance of the display.

Therefore it is desirable, to the greatest possible extent to make those gaps invisible to users of the modular displays. The gaps may be made visible by two different effects. Light emitted by the pixels may be reflected, refracted, or absorbed by the gaps between tiles. Similarly, external light or light from outside the display may be reflected, absorbed or refracted by the gaps.

For a variety of reasons, the individual display tiles may use a glass panel over the individual pixels or display elements. The edges of adjacent glass panels then define the gap. In many cases, it may be desirable to increase the thickness of the glass panel. One reason for doing so is to reduce breakage of the glass panels during processing or thereafter.

However, to the extent that the glass panel is thickened, the gap is also lengthened, thereby increasing the possibility that the gap may become visible to the user. Generally the gaps may include two portions. A surface portion may be covered by an overlying mullion or other matrix. However, the body portion, beneath the surface of the gap, may or may not be hidden by an overlying mullion from all viewing angles.

Thus, there is an need for ways to reduce the visibility of the seams of modular displays, particularly in displays using thicker glass panels.

BRIEF DESCRIPTION OF THE DRAWINGS

FIG. 5 is an enlarged cross-sectional view of an embodiment in the region I of FIG. 4 in one embodiment of the present invention;

FIG. 6 is an enlarged cross-sectional view of an embodiment in the region II of FIG. 4 in one embodiment of the present invention;

FIG. 7 is an enlarged cross-sectional view of an embodiment in the region III of FIG. 4 in accordance with one embodiment of the present invention;

FIG. 8 is an enlarged cross-sectional view of an embodiment in the region IV of FIG. 4 in accordance with one embodiment of the present invention.

DETAILED DESCRIPTION

Figure 1:
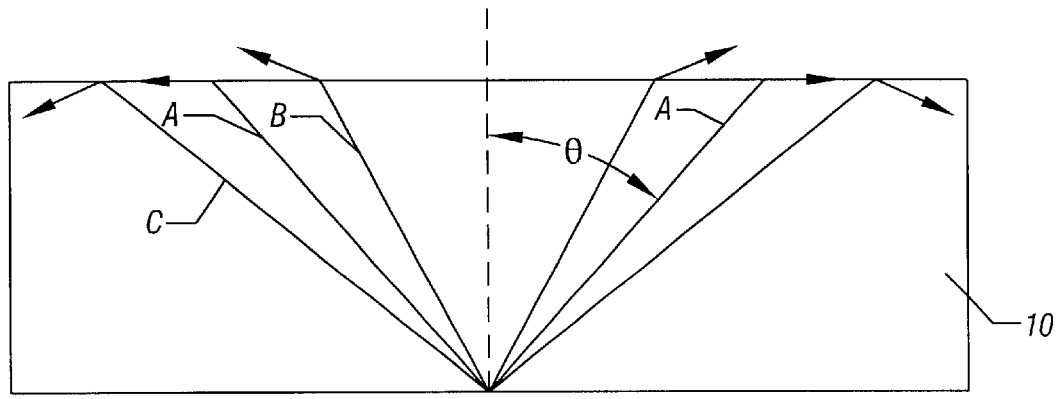
FIG. 1 is a schematic depiction in accordance with one embodiment of the present invention.

In FIG. 1, the front glass panel 10 of an emissive light display, such as an organic light emitting device (OLED) display is illustrated. The upwardly directed arrows illustrate light rays originating from a point (not shown in FIG. 1) on the bottom surface of the panel 10. The illustrated light rays B exit the panel 10 and the light rays C are totally internally reflected from the top surface of the panel 10 and therefore are trapped in the panel 10. At the transition between these two cases, a ray may be reflected to an angle parallel to the top surface of the panel 10. The ray A, reflected parallel to the top surface, has an angle (from the vertical) of incidence called the critical angle $\theta_c$. Light rays B reaching the upper surface of the panel 10 with angles less than the critical angle exit the glass and light rays C reaching the surface with angles of incidence larger than the critical angle are totally internally reflected. The critical angle is dependent on the index refraction of the glass panel 10.

Figure 2:
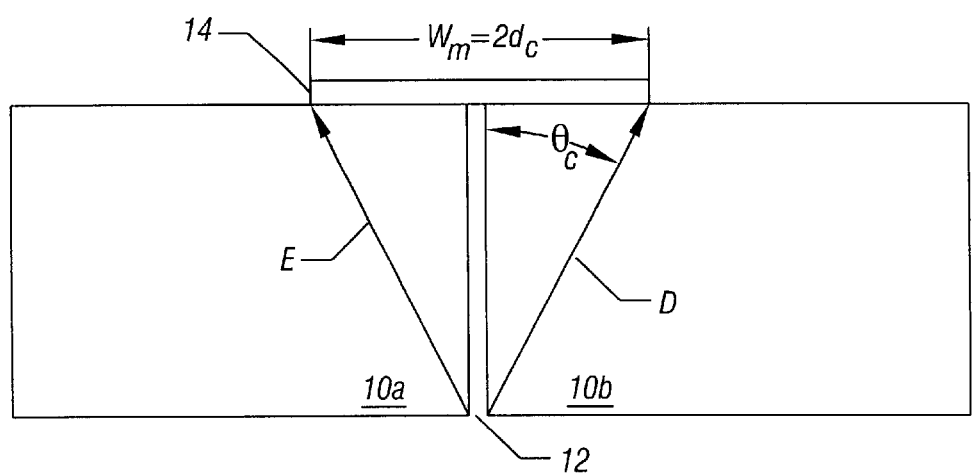
FIG. 2 is a schematic depiction in accordance with one embodiment of the present invention.

In some cases, two glass panels 10a and 10b abut and form a gap 12 as illustrated in FIG. 2. The light emitted at or reflected by the lower surface of the gap formed by the panels 10a and 10b, may escape the glass panel 10 and cause the gap 12 to be more readily discerned by users of a display that is made from the panels 10a and 10b. To obscure the gap 12, a black line 14 may be positioned across the gap 12 to act as a mullion, as illustrated in FIG. 2. The length of the black line 14 is indicated as $W_m$.

The black line 14 may be formed in a variety of different ways. The black line 14 may be effectively a mullion or strip positioned along the length of the gap. Alternatively, the black line 14 may be a black mark or paint stripe that obscures the top of the gap 12 as well as all or a portion of the body of the gap 12 extending downwardly from the top of the gap 12.

In FIG. 2, two light rays D and E are indicated that extend upwardly at the critical angle $\theta_c$. Those light rays just intersect the ends of the black line 14 in one embodiment.

Because of the critical angle, a light ray originating (emitted, reflected, scattered, etc.) at a point within the panels 10 can escape from the panels by traveling at most a lateral distance of $d_c$ equal to the thickness of the glass panels 10 times the tangent of the critical angle. Therefore, light from any part of the gap 12, assuming zero gap width, can be completely blocked by putting a black line 14 of width equal to $2d_c$ over the gap 12 as illustrated in FIG. 2. Because of the symmetry of optics, this black line 14 may also block any external rays from illuminating the gap 12 and thereby making the gap 12 visible to users. Thus, if the black line 14 has a width $W_m$ and the gap 12 has zero thickness, the gap 12 is obscured from both internal reflections and refractions and external originating reflections and refractions.

To the extent that the black line 14 has a width less than $2d_c$ but wider than the width of the top of the gap 12, then it completely hides the top of the gap 12 and a portion of the gap region near the top of the gap 12. Thus, this black line 14 makes the top of the gap 12 and part or all of the underlying gap 12 invisible to an observer. Of course in practice, the black line 14 is slightly wider to account for any finite width of the gap 12 and any tolerance for positioning the black line 14 directly above the gap 12.

In this way, a large area display may be formed of a plurality of light emitting tiles. Each tile may include a glass panel 10. The glass panels 10 of adjacent tiles are abutted along gaps 12. Each tile produces a portion of the overall displayed image. To the extent that the seams between adjacent tiles are not readily visible, a relatively seamless displayed image may result. Putting a black line 14 over all the gaps 12 tends to make the gaps less visible. Mullions or strips may be positioned around the edges of groups of tiles in some embodiments. Making the width of the black lines identical in size and shape to the width of the mullions between all the pixel rows and columns of the display, may reduce the visual disparity between mullions and the black lines. In addition, the pattern of black lines increases the contrast of the displayed image.

Figure 3:
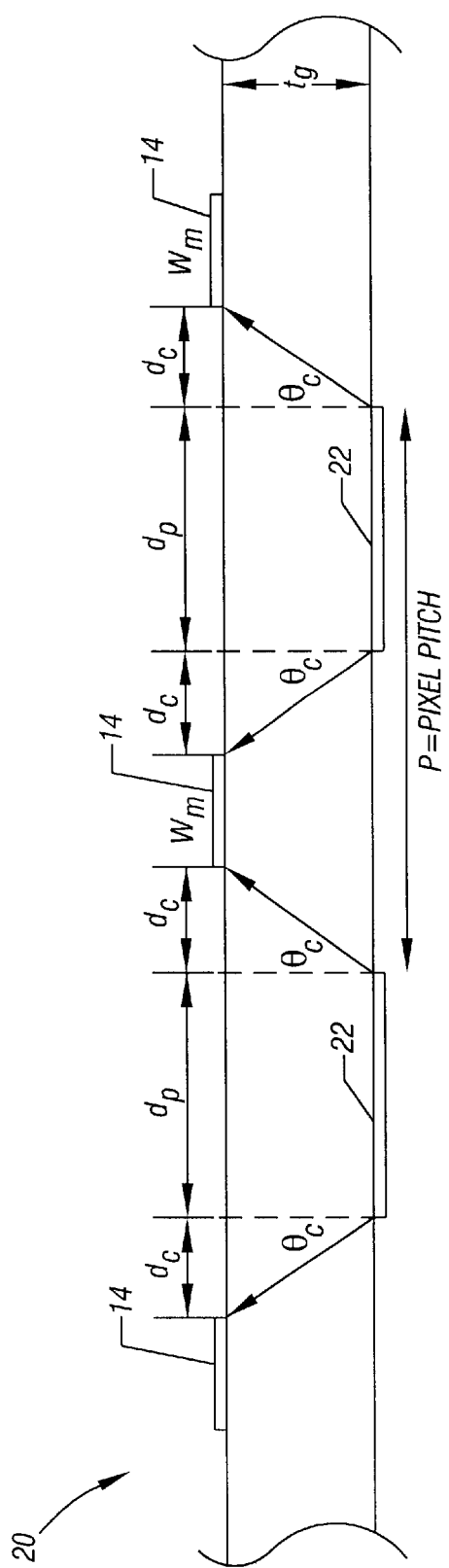
FIG. 3 is a schematic depiction in accordance with one embodiment of the present invention.

Turning next to FIG. 3, a portion of a display panel 20 is illustrated. A pair of emissive regions 22 are positioned on the bottom surface of the display panel 20, spaced from one another at the pixel pitch P. In one embodiment, the width of emissive area 22 may equal half of the pixel pitch. Each of the emissive regions 22 emit light upwardly through the tile panel 20. As described previously, the emitted light has a critical angle of $\theta_c$ as indicated in FIG. 3. The angle $\theta_c$ determines where emitted light can exit the display panel 20. For a pixel with an active area equal to half the pixel pitch, the maximum width from which light can exit is $d_p + 2d_c$. The geometry of the black line 14 which has the width $W_m$ determines if any of the emitted light will be blocked. The width $W_m$ is chosen so that no light would be blocked. Depending on the glass thickness ($t_g$) a particular black line width may or may not block some light emitted from a pixel.

Thus, light rays can exit the glass panel 20 through a region having an area whose width is $2d_c$ plus $d_p$. The panel 20 may have an array of pixels spaced apart by a distance known as the pixel pitch (P). To define the black line 14 so as not to block visible light, the black line width ($W_m$) should be equal to P minus $d_p$ minus $2d_c$. In some embodiments, avoiding the blocking of emitted light may be important for improving the display's viewing brightness in all directions.

Thus, two competing goals for a large area or modular display arise. It may be desirable to hide the entire gap region with a mullion to avoid the disruption of the seamless appearance of a composite image formed from a plurality of tiles. It may be advantageous in some embodiments to make the mullion and black lines of substantially the same width for visual uniformity. At the same time, the structure that hides the gap region should not be so extensive as to block light emitted by the light emitting elements and thereby reduce the brightness of the display in one embodiment. Thus, the width of the black lines 14 should be equal to $W_m$ times $2d_c$, to hide the gap 12 and at the same time may be less than or equal to $W_m$ times $P-d_p-2d_c$ to avoid blocking light from the light emitting regions 22.

Figure 4:
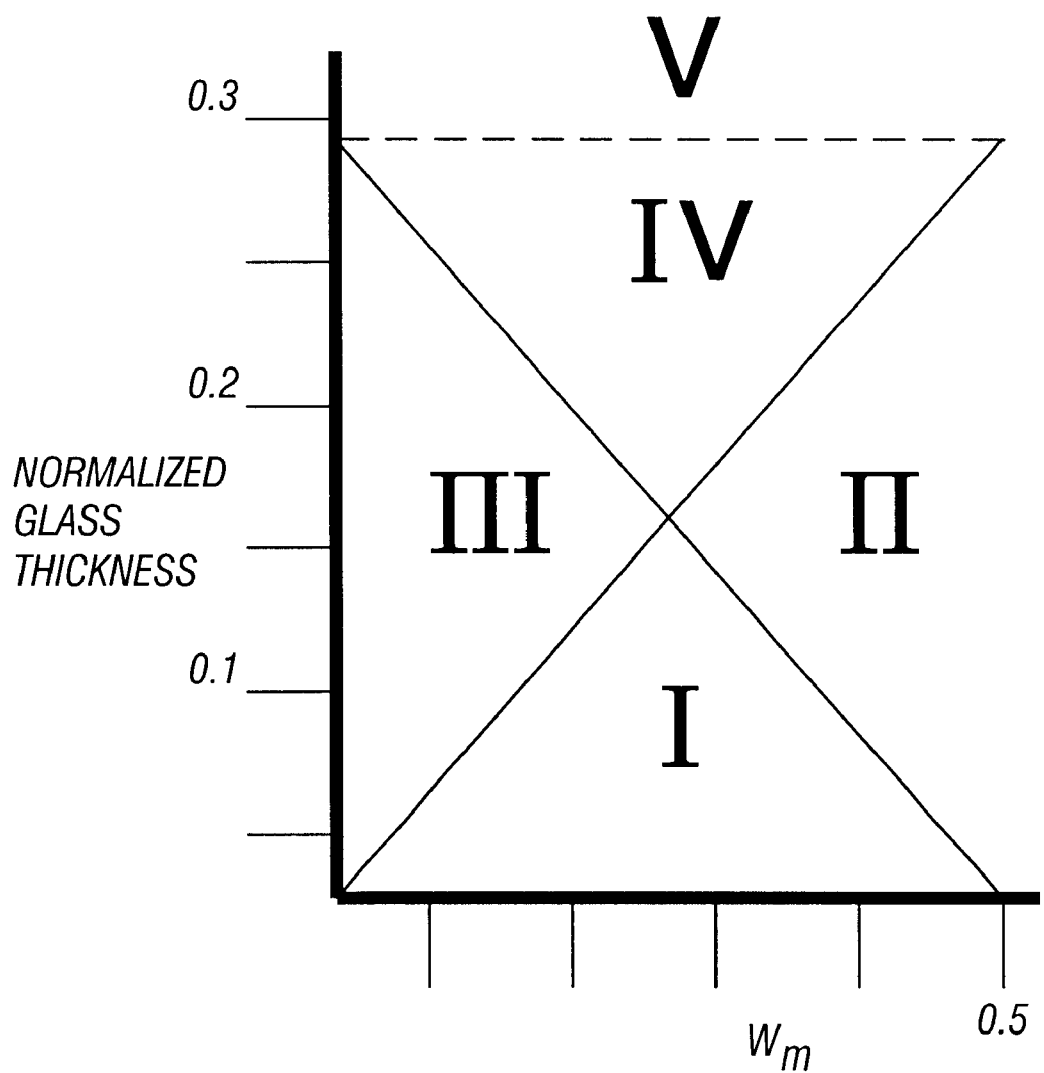
FIG. 4 is a generalized graph of normalized glass thickness versus black line width in accordance with one embodiment of the present invention.

These two design goals are plotted for an example with a pixel pitch of twice the width ($d_p$) of the emitting region 22 in FIG. 4. Thus, horizontal axis in FIG. 4 is a measure of the width of the black matrix 14 while the vertical axis gives normalized glass thickness $t_g$. In particularly, the normalized glass thickness on the vertical axis in FIG. 4 is equal to the actual glass thickness divided by the pixel pitch.

The design and conditions that simultaneously result in hiding the top of the gap 12, and the entire gap region, while not blocking any visible light emission, correspond generally to the region I in FIG. 4. In the case where one wants to use the thickest glass possible, the most desirable design point is the one with the greatest possible front panel glass thickness which occurs at the top of the region I. A display meeting the conditions of region I results in making a large area display with integrated individual tiles, that are not detectable via the gaps between the tiles.

As one moves upwardly from region I along the vertical or glass thickness axis, into the region II in FIG. 4, the gap 12 is not visible but some light is blocked because of the relatively large black line 14 width $W_m$ and larger glass thickness. Conversely, moving to a smaller black line 14 width $W_m$ moves into to region III. There, light is not blocked and the top of the gap 12 is not visible but some of the gap region will be optically accessible and may be visible because of the reduced black line 14 width.

Under still other conditions, above a normalized glass thickness of 0.15, one enters the region IV. Generally in the region IV, the top of the gap 12 may be invisible, but some of the gap region is visible and some of the light rays originating in the gap region will be blocked. Above 0.3 normalized glass thickness, in region V, light emitted from an emissive pixel cannot escape from the display by a single reflection at the gap wall.

While ideally, one may wish to aim for the top of the region I to obtain the largest possible glass thickness while eliminating light blockage and visibility of the gap, in many practical situations, the normalized glass thickness must exceed 0.15. Among the possible reasons for using thicker glass, may be the need to use thicker glass substrates to reduce breakage and thereby costs. In addition, thicker glass substrates may be more amenable to processing with conventional equipment. Commonly, the panel 20 may have deposited on it a number of layers. For example, in connection with OLED displays, the panel 20 may have deposited thereon the OLED material, the row electrodes, the column electrodes and a variety of other contacts and materials. To facilitate the processing of these materials, equipment that is adapted to particular glass thicknesses may be preferred.

The display 30, shown in FIG. 5, includes a pair of display modules 10 abutted side to side to form a gap 12. Generally, each of the modules 10 would normally have much greater extension but a portion is shown for illustration purposes. Each display module 10 includes a plurality of light emitting regions 22 positioned along the lower surface of a transmissive panel 20 which may be formed of glass. In the embodiment illustrated in FIG. 5, a design in region I is illustrated, for example, with a normalized glass thickness of around 0.15. A black line 14 is positioned between adjacent light emitting regions 22 and mullions 32 are positioned over the gaps 12. In one embodiment, the mullions 32 may have a width along the panel 20 equal to the width of the black line 14 to produce an overall regular appearance.

The mullion 32 simultaneously hides the gap 12 top and underlying gap region while not blocking any emitted light. There may be no direct optical paths between the gap 12 region and the viewer. Any rays reflected or refracted at the gap 12 may not reach the viewer and any external rays may not reach the gap. The optical properties of the gap region may not be important to eliminating the visibility of the gap region when one has designed into the region I of FIG. 4. The gap surfaces may be smoothed or textured and the surfaces may be reflecting or absorbing and the gap region may contain any or no material. The surfaces may be made absorbing by blackening those surfaces in one embodiment.

Moving to the region II of FIG. 4, an illustrative design is shown in FIG. 6. In this case, the mullions 32 and black lines 14 have been widened. Otherwise, the display 30a is the same as the display 30 shown in FIG. 5. Because of the widened mullions 32 and lines 14, the gap 12 top and entire gap region may be well hidden, but some of the emitted light will be blocked. There are no direct optical paths between the gap region and the viewer. Any ray scattering in the gap 12 does not reach viewer and any external rays do not reach the gap 12. The wider mullion 32 and black lines 14 suppress more ambient light and increase the display contrast, at least at normal viewing angles. The optical properties of the gap region are not important in eliminating the visibility of the gap region. The gap surfaces may be smooth or textured and the surfaces may be reflecting or absorbing and the gap region may contain any or no material.

Moving to region III of FIG. 4, and referring to FIG. 7, the structure 30b is similar to the structure shown in FIG. 5, except that the mullions 32 and black lines 14 have been substantially reduced in width. The mullions 32 completely hide the top of the gap 12, but only partially hide the underlying gap region while not blocking any amount of emitted light. There are direct optical paths between the underlying gap region and the viewer. These may enable detection of the gap region unless the gap region is made nonscattering. Suitable nonscattering surfaces can be perfectly transmissive or index-matched. Alternatively mirror-like or absorbing surfaces may also be used. Index matching and absorbing features can be done with either smooth or textured glass edges. Mirror-like surfaces involve glass substrates with smooth edges.

Continuing on to region IV, existing above a normalized glass thickness of 0.15, the mullions 32 can hide the gap 12 top but not the entire gap region and will block some emitted light, as shown in FIG. 8. There are direct optical paths between the gap regions and the viewer. These enable the detection of the gap region unless the gap region is made nonscattering. Again nonscattering surfaces may be transmissive (index-matched), mirror-like, or absorbing. Index-matching and absorbing features may be accomplished with either smooth or textured glass substrate edges. Mirror-like surfaces involve substrates with smooth edges.

Thus, in region IV, it is important to include a combination of features. Those features generally include the use of mullion 32, the use of a black lines 14, and a contrast reducer 35 in the gap 12 region. The contrast reducer 35 may be a filler in the gap 12 that makes the gap 12 substantially non-scattering, for example, by using an index-matched optical adhesive or a substantially absorbing material. Alternatively, the panel 10 edges may be made mirror-like or absorbing. Absent this combination of features, the larger glass thicknesses associated with region IV may result in excessive gap visibility.

Figure 9:
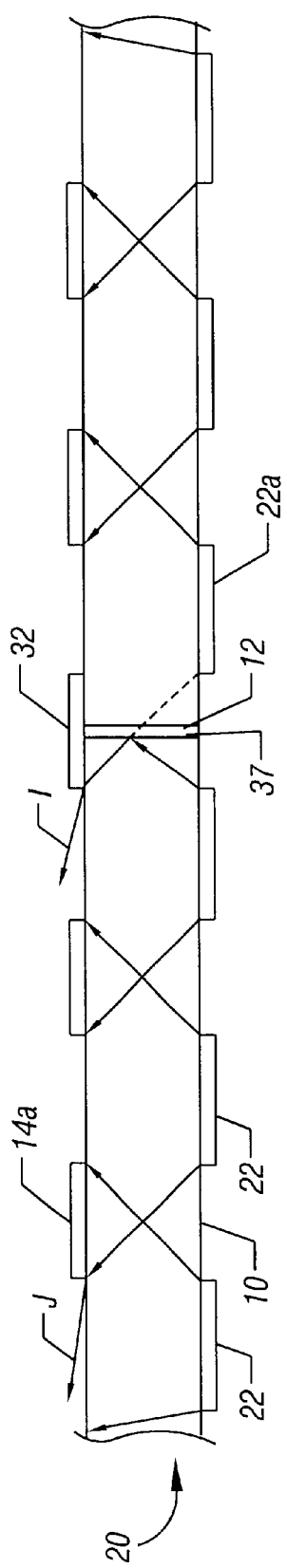
FIG. 9 is an enlarged cross-sectional view of an embodiment in the region V of FIG. 4 in accordance with one embodiment of the present invention.

Finally turning to FIG. 9, an example in region V is illustrated, having a normalized glass thickness of greater than 0.3. The mullion 32 in FIG. 9 hides the gap top but not the entire gap region while blocking emitted light. There are direct optical paths between the gap region and the viewer. In addition, in region V, two new optical paths are possible. A ray I from an optical path which is reflected from the gap region surface exits to the viewer. From the viewer's point of view, this ray I appears to be emitted from the light emitting region 22a. This creates a visible artifact. The ray J is a ray that crosses from one pixel light emitter to the next within the glass tile 10 before exiting. It crosses under the black matrix 14a. If this were the location of a gap region, then this ray may be altered, causing an artifact. These artifacts enable detection of the gap region unless the gap region is made transmissive and substantially nonscattering.

Putting an index matching material 37 in the gap region makes the gap region transmissive and substantially nonreflective and substantially nonscattering. Index matching may be done using either smooth or textured glass substrate edges. Index matching materials include optical adhesives.

In some cases, emitted light may be blocked by black lines 14 and mullions 32. This result may not be symmetrical. As one moves from a normal viewing angle to larger, horizontal viewing angles, light is first cut off from the emitting area of the pixel closest to the edge of the direction that the viewer is moving. If the emitting area 22 is divided into vertical rectangular colored subpixels, a color shift may occur. The color shift arises because light from one of the vertically oriented subpixels is preferentially blocked. Preferential blocking of light from one color subpixel changes the color balance.

The color shift may be lessened by orienting the color subpixels horizontally rather than vertically. In such case, any light blocked by a mullion 32 or black matrix 14 would be an equal mix of red, green and blue (or what ever other color space is utilized).

Any light blocked by a mullion 32 or black matrix 14 results in a reduction of intensity as the horizontal viewing angle is increased. The reduction of image brightness with viewing angle is common in displays. The horizontal orientation of the color subpixels means that a color shift does occur for vertical viewing angles. Viewers move less in the vertical direction, in general than they do in the horizontal direction. Therefore the color shift for large viewing angles is less critical.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A display comprising:
   a pair of substantially coplanar display panels, each panel including a plurality of pixels having a pixel pitch, said display panels abutting along a gap;
   each panel including transparent layer over said pixels, said transparent layer having a ratio of thickness to pixel itch of between 0.15 and about 0.3;
   a black line position over said transparent layer over said pixels; and
   a mullion positioned over said gap, said gap being substantively non-scattering to light.

2. The display of claim 1 wherein said display panels are panels for an organic light emitting device display.

3. The display of claim 1 wherein said line and said mullion have widths and the widths of said black line and said mullion are substantially identical.

4. The display of claim 1 including a contrast reducer in the gap.

5. The display of claim 4 wherein said contrast reducer is a material that makes the gap nonscattering.

6. The display of claim 5 wherein said contrast reducer includes an optical adhesive.

7. The display of claim 1 wherein said transparent layers have mirror-like surfaces adjacent to said gap.

8. The display of claim 1 wherein said gap is made light absorbing by making the edges of said transparent layer adjacent to said gap light absorbing.

9. The display of claim 1 wherein surfaces of said transparent layers adjacent to said gap are made mirror-like.

10. The display of claim 1 wherein the surfaces of said transparent layer adjacent to said gap are blackened to make them light absorbing.

11. A method comprising:

forming display panels with a transparent layer having a ratio of thickness to pixel pitch of greater than 0.15 and less than 0.3;

abutting substantially coplanar display panels along a gap;

positioning a black me over said transparent layer over said pixels;

positioning a mullion over said gap; and altering said gap to make said gap substantially non-scattering to light.

12. The method of claim 11 including forming the line and the mullion with substantially identical width.

13. The method of claim 11 including forming a contrast reducer in said gap.

14. The method of claim 11 including applying optical adhesive in said gap.

15. The method of claim 11 including forming a mirror-like surface on said transparent layers adjacent to said gap.

16. The method of claim 11 including processing the edges of said transparent layers adjacent to said gap to make said edges light absorbing.

17. The method of claim 11 including making said surfaces of said transparent layers adjacent to said gap mirror-like.

18. The method of claim 11 including making the surfaces of said transparent layers adjacent to said gap textured to make them light absorbing.

* * * * *

UNITED STATES PATENT AND TRADEMARK OFFICE
CERTIFICATE OF CORRECTION

PATENT NO.     : 6,600,144 B2
DATED          : July 29, 2003
INVENTOR(S)    : Dennis L. Matthies It is certified that error appears in the above-identified patent and that said Letters Patent is hereby corrected as shown below:

<u>Column 6,</u>
Line 42, "itch" should be -- pitch --;
Line 43, "position" should be -- positioned --.

Signed and Sealed this

Thirtieth Day of September, 2003

JAMES E. ROGAN
*Director of the United States Patent and Trademark Office*